(12) United States Patent
Blanchard et al.

(10) Patent No.: US 10,593,813 B2
(45) Date of Patent: Mar. 17, 2020

(54) VERTICAL RECTIFIER WITH ADDED INTERMEDIATE REGION

(71) Applicant: MaxPower Semiconductor Inc., San Jose, CA (US)

(72) Inventors: Richard A. Blanchard, Los Altos, CA (US); Mohamed N. Darwish, Campbell, CA (US); Jun Zeng, Torrance, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 0 days.

(21) Appl. No.: 16/016,510

(22) Filed: Jun. 22, 2018

(65) Prior Publication Data

US 2019/0067491 A1    Feb. 28, 2019

Related U.S. Application Data

(60) Provisional application No. 62/523,753, filed on Jun. 22, 2017, provisional application No. 62/683,929, filed on Jun. 12, 2018.

(51) Int. Cl.
*H01L 29/06* (2006.01)
*H01L 29/861* (2006.01)
(Continued)

(52) U.S. Cl.
CPC ...... *H01L 29/861* (2013.01); *H01L 21/26513* (2013.01); *H01L 29/04* (2013.01);
(Continued)

(58) Field of Classification Search
CPC ............. H01L 29/861; H01L 29/66136; H01L 29/417; H01L 29/16; H01L 29/0692;
(Continued)

(56) References Cited

U.S. PATENT DOCUMENTS

2010/0264488 A1* 10/2010 Hsieh .................. H01L 29/1095
257/334
2012/0083083 A1    4/2012 Hshieh
(Continued)

FOREIGN PATENT DOCUMENTS

JP          2009194320 A    8/2009
KR    10-2016-0010967 A    1/2016

OTHER PUBLICATIONS

KIPO International Search Report for PCT/US2018/039158, dated Nov. 7, 2018.
(Continued)

*Primary Examiner* — Didarul A Mazumder
*Assistant Examiner* — Wasiul Haider
(74) *Attorney, Agent, or Firm* — Groover & Associates PLLC; Robert O. Groover, III; Gwendolyn G. Corcoran

(57) ABSTRACT

A new semiconductor rectifier structure. In general, a MOS-transistor-like structure is located above a JFET-like deeper structure. The present application teaches ways to combine and optimize these two structures in a merged device so that the resulting combined structure achieves both a low forward voltage and a high reverse breakdown voltage in a relatively small area. In one class of innovative implementations, an insulated (or partially insulated) trench is used to define a vertical channel in a body region along the sidewall of a trench, so that majority carriers from a "source" region (typically n+) can flow through the channel. An added "pocket" diffusion, of the same conductivity type as the body region (p-type in this example), provides an intermediate region around the bottom of the trench. This intermediate diffusion, and an additional deep region of the same conductivity type, define a deep JFET-like device which is in series with the MOS channel portion of the diode. This advantageously permits the MOS channel portion to be reasonably short, and to have a reasonably low threshold (Continued)

voltage, since the high-voltage withstand characteristics are defined by the deep JFET-like device.

17 Claims, 15 Drawing Sheets

(51) Int. Cl.
| | | |
|---|---|---|
| | *H01L 29/40* | (2006.01) |
| | *H01L 29/66* | (2006.01) |
| | *H01L 21/265* | (2006.01) |
| | *H01L 29/04* | (2006.01) |
| | *H01L 29/16* | (2006.01) |
| | *H01L 29/417* | (2006.01) |

(52) U.S. Cl.
CPC ...... *H01L 29/0619* (2013.01); *H01L 29/0623* (2013.01); *H01L 29/0692* (2013.01); *H01L 29/16* (2013.01); *H01L 29/407* (2013.01); *H01L 29/417* (2013.01); *H01L 29/6609* (2013.01); *H01L 29/66136* (2013.01)

(58) Field of Classification Search
CPC ..... H01L 29/04; H01L 29/0623; H01L 29/78; H01L 29/6609; H01L 29/423; H01L 29/0619; H01L 29/407
See application file for complete search history.

(56) References Cited

U.S. PATENT DOCUMENTS

| | | | |
|---|---|---|---|
| 2014/0042525 A1* | 2/2014 | Darwish | H01L 29/7395 257/329 |
| 2015/0091023 A1* | 4/2015 | Boettcher | H01L 29/407 257/77 |
| 2015/0340360 A1 | 11/2015 | Darwish et al. | |
| 2016/0372538 A1 | 12/2016 | Jin et al. | |
| 2019/0057959 A1* | 2/2019 | Or-Bach | H01L 25/18 |

OTHER PUBLICATIONS

KIPO Written Opinion of the International Searching Authority for PCT/US2018/039158, dated Nov. 7, 2018.

* cited by examiner

VERTICAL RECTIFIER WITH ADDED INTERMEDIATE REGION

CROSS-REFERENCE

Priority is claimed from U.S. patent applications 62/523,753 and 62/683,929, both of which are hereby incorporated by reference.

BACKGROUND

The present application relates to power semiconductor devices, and more particularly to rectifiers.

Note that the points discussed below may reflect the hindsight gained from the disclosed inventions, and are not necessarily admitted to be prior art.

One of the most basic elements of electric circuits is a rectifier, i.e. an element which will pass DC current in only one direction. (Since this is a two-terminal device, it is often referred to as a rectifying diode.) Such diodes are used in many motor control and power conversion circuits. In such applications, the currents which may have to be handled may be large.

Desirable features of a rectifying diode for power applications include low forward voltage drop, high reverse breakdown, fast reverse recovery, and low reverse leakage.

Junction Diode Rectifiers

As is well known, any p-n junction diode will have a voltage drop when current is flowing. For silicon, this is about 0.6 Volts. When large currents flow through a diode, a drop of even a volt will cause significant power dissipation. This power dissipation is undesirable.

Schottky Barrier Diode Rectifiers

A Schottky barrier diode (or "SBD") will typically provide a lower forward voltage than a junction diode. However, Schottky diodes have more reverse leakage, and (at least in silicon) typically have lower reverse breakdown than junction diodes.

Field Effect Rectifiers

A device referred to as a field effect rectifier is described in U.S. Pat. No. 8,148,748. It has a structure similar to that of a lateral channel 1 DMOS FET, with its source and body, its gate, and its channel region located on the front surface, and its drain on the back surface. There are two major differences between the field effect rectifier of the '748 patent and a conventional DMOS FET. These differences are:

1. There is an additional p-type region in the center of the gate in the field effect rectifier. This additional p-type region or "p-pocket" is self-aligned to the edge of the source and body region that it faces. (This self-alignment is obtained by simultaneously forming the opening that is used to introduce dopant that forms these two p-type regions.) The distance between the p-intermediate region and the nearby p-doped body must be carefully controlled so the desired device characteristics are obtained.

2. The source and body, the gate, the channel, and the additional p-pocket region described above are all electrically connected to one terminal, with the drain region connected to the second terminal. (For a rectifier that uses with an n-type substrate, the metal region that connects to the first terminal forms the anode, while the metal region that connects to the drain forms the cathode.)

3. The body region's net dopant concentration as a function of location in the region between its source and its drain must be carefully tailored to provide the desired rectifying characteristics.

Processing steps that may be used include the use of an implanted body with a retrograde profile, the use of multiple implants, or the use of an oxidation step that depletes dopant from the surface region where the dopant has already been introduced. The goal of these processing steps is to obtain a body region with a net dopant that is either uniform or has its peak concentration closer to the "drain" end of the body. Either of these net body dopant profiles result in rectification.

The field effect rectifier described in the '748 patent provides a current vs. voltage curve with a lower forward voltage drop for the same current rating than both conventional pn-junction diodes and Schottky diodes. A more efficient rectifier allows electrical and electronic equipment to operate with lower power dissipation, which is an important and long standing goal.

Vertical Rectifier with Added Intermediate Region

The present application provides a new semiconductor rectifier structure. In general, a MOS-transistor-like structure is located above a JFET-like deeper structure. The present application teaches ways to combine and optimize these two structures in a merged device so that the resulting combined structure achieves both a low forward voltage and a high reverse breakdown voltage in a relatively small area.

In one class of innovative implementations, an insulated (or partially insulated) trench is used to define a vertical channel in a body region along the sidewall of a trench, so that majority carriers from a "source" region (typically n+) can flow through the channel An added "pocket" diffusion, of the same conductivity type as the body region (p-type in this example), is provided around the bottom of the trench. This intermediate diffusion, and an additional deep region of the same conductivity type, define a deep JFET-like device which is in series with the MOS channel portion of the diode. This advantageously permits the MOS channel portion to be reasonably short, and to have a reasonably low threshold voltage, since the high-voltage withstand characteristics are defined by the deep JFET-like device. The vertical nature of the carrier flow results in increased current density; this provides an area advantage as compared to other rectifier structures. The use of a single metallization on the top surface further increases density.

The pinch-off effect of the deep JFET-like device means that the MOS channel can be short and have a low threshold voltage, since the pinch-off effect will be sufficient to keep leakage low near reverse breakdown. Thus the MOS diode can be optimized for a low turn-on voltage, which provides a low forward voltage drop. For example, additional diffusion components can be added to reduce the turn-on voltage of the MOS diode, without degrading the breakdown voltage of the device.

Notionally, this device can be thought of as a series combination of a deep JFET-like depletion transistor with a MOS diode.

Because of the importance of the deep JFET-like device, the lateral separation between the intermediate diffusions and the additional deep regions has an important effect on the forward voltage drop of the device in operation.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application provides a new semiconductor rectifier structure. In general, a MOS-transistor-like vertical structure is located above a JFET-like deeper structure. The present application teaches ways to combine and optimize these two structures in a merged device so that the resulting combined structure achieves both a low forward voltage and a high reverse breakdown voltage in a relatively small area.

Figure 1A:
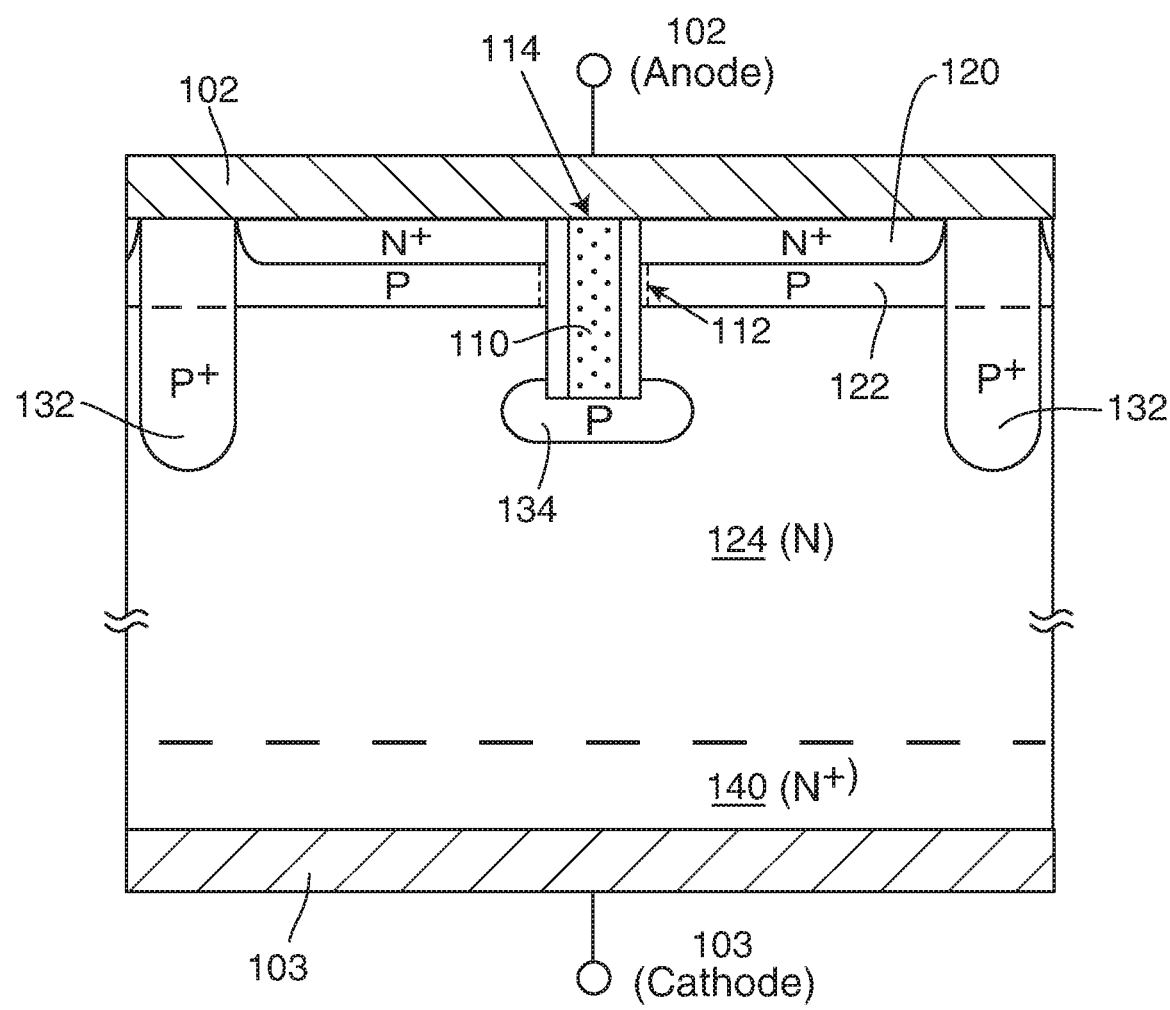
FIG. 1A schematically shows a first example of a semiconductor rectifier.

In one class of innovative implementations, an insulated (or partially insulated) trench is used to define a vertical channel in a body region along the sidewall of a trench, so that majority carriers from a "source" region (typically n+) can flow through the channel An insulated (or partially insulated) gate electrode 110 is used to define a vertical channel region 112 along the sidewall of a trench 114, as shown in FIG. 1A. A source 120 (n+ in this example) is surrounded by a body region 122 (p-type in this example), which separates it from an n-type epitaxial layer 124 on an n+ substrate 126. Deep p+ diffusions 132, in combination with a p-type "intermediate" diffusion 134, shape the depletion boundaries under reverse bias, to thereby provide a pinch-off effect. This pinch-off effect means that the MOS channel 112 can be relatively short and have a relatively low threshold voltage, since the pinch-off effect will be sufficient to prevent leakage near breakdown. Notionally, this device can be thought of as a series combination of a depletion-mode transistor with a majority carrier injection structure; more precisely, the majority carrier injection structure in this example includes a MOS diode in parallel with a junction diode.

Note that various regions have been referred to using the nomenclature for transistors. However, since the illustrated structure is only a two-terminal device, the n+ "source", the gate, the p-type intermediate region, and the p-type "body" together simply act as an anode, and the n+ "drain" 140 acts as a cathode. Front surface metallization 102 provides an anode terminal, and back surface metallization 103 provides a cathode terminal.

Figure 1B:
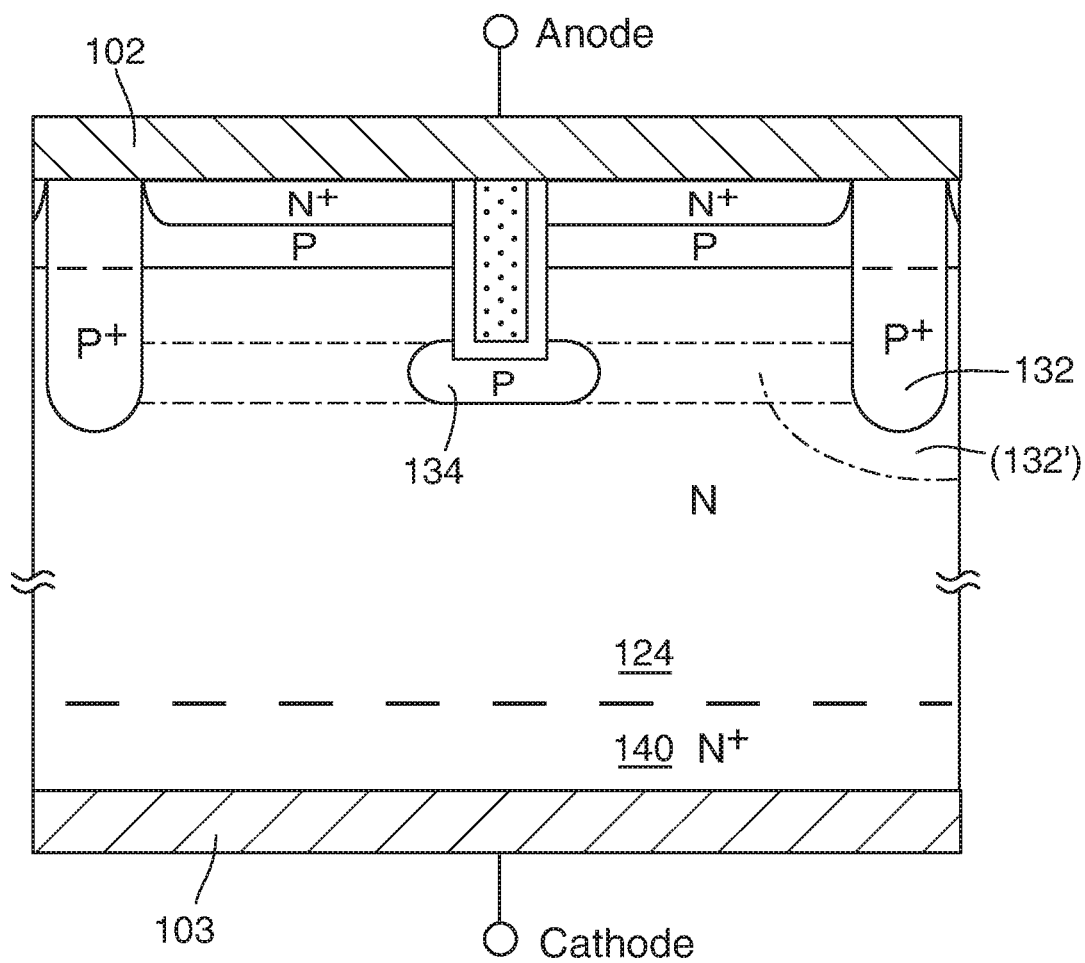
FIG. 1B schematically shows another example of a semiconductor rectifier.

The trench rectifier structure of FIG. 1A shows an ohmic connection from the gate electrode to the intermediate region being made at the trench bottom. FIG. 1B shows an alternative embodiment, where patterned lines of the same implant as the intermediate region are used to provide a buried connection from the deep P+ body contact regions to the p-type intermediate region. In either method of contacting the buried p-type intermediate region, connection need only be made at a relatively small number of locations, since this structure does not usually conduct large amounts of current. If the p-type buried region will conduct appreciable current, additional connecting regions can optionally be included.

Figure 1C:
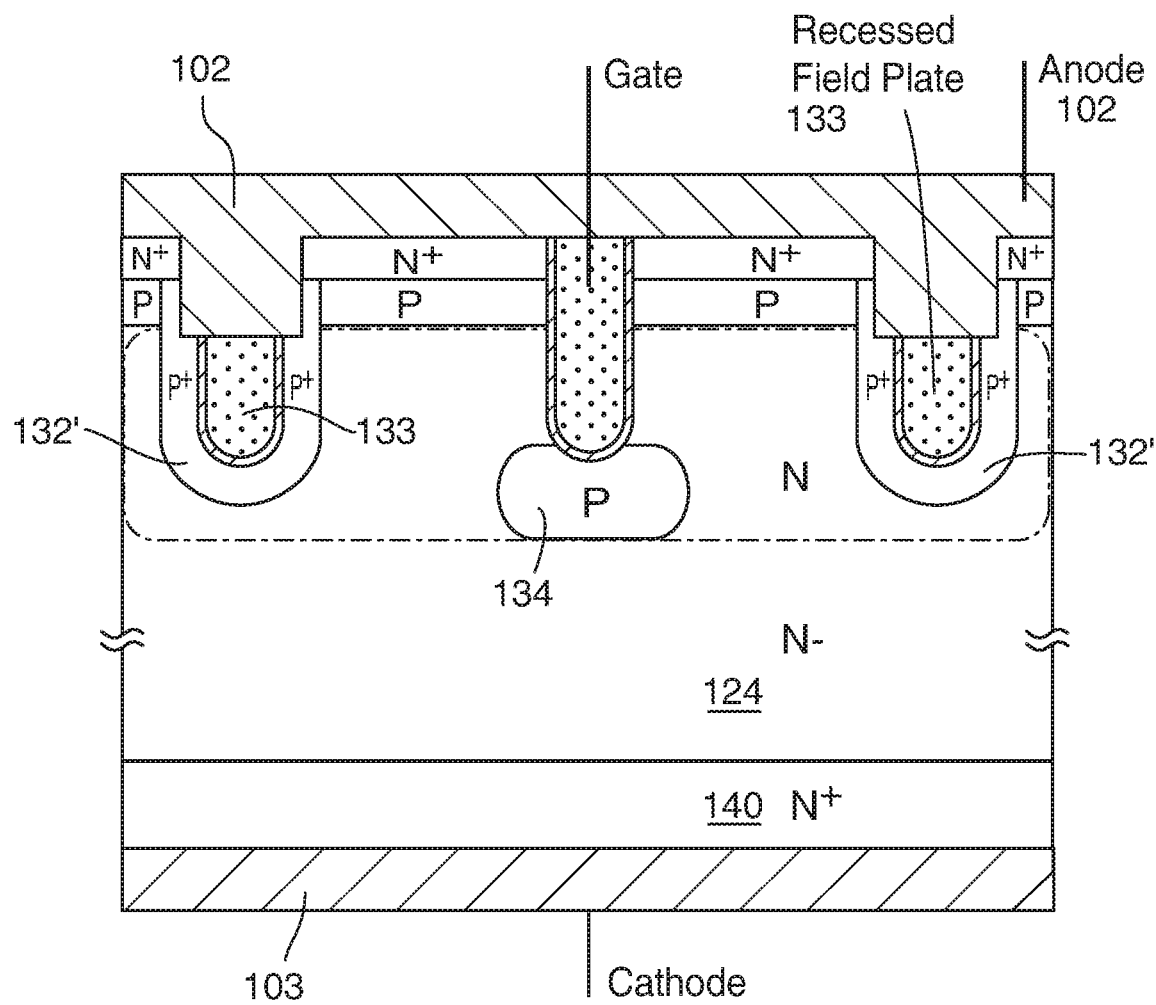
FIG. 1C schematically shows another example of a semiconductor rectifier.

FIG. 1C shows another modification, where the p+ body contact regions 132 have been replaced by p+ regions 132' which surround recessed field plates 133.

Figure 2A:
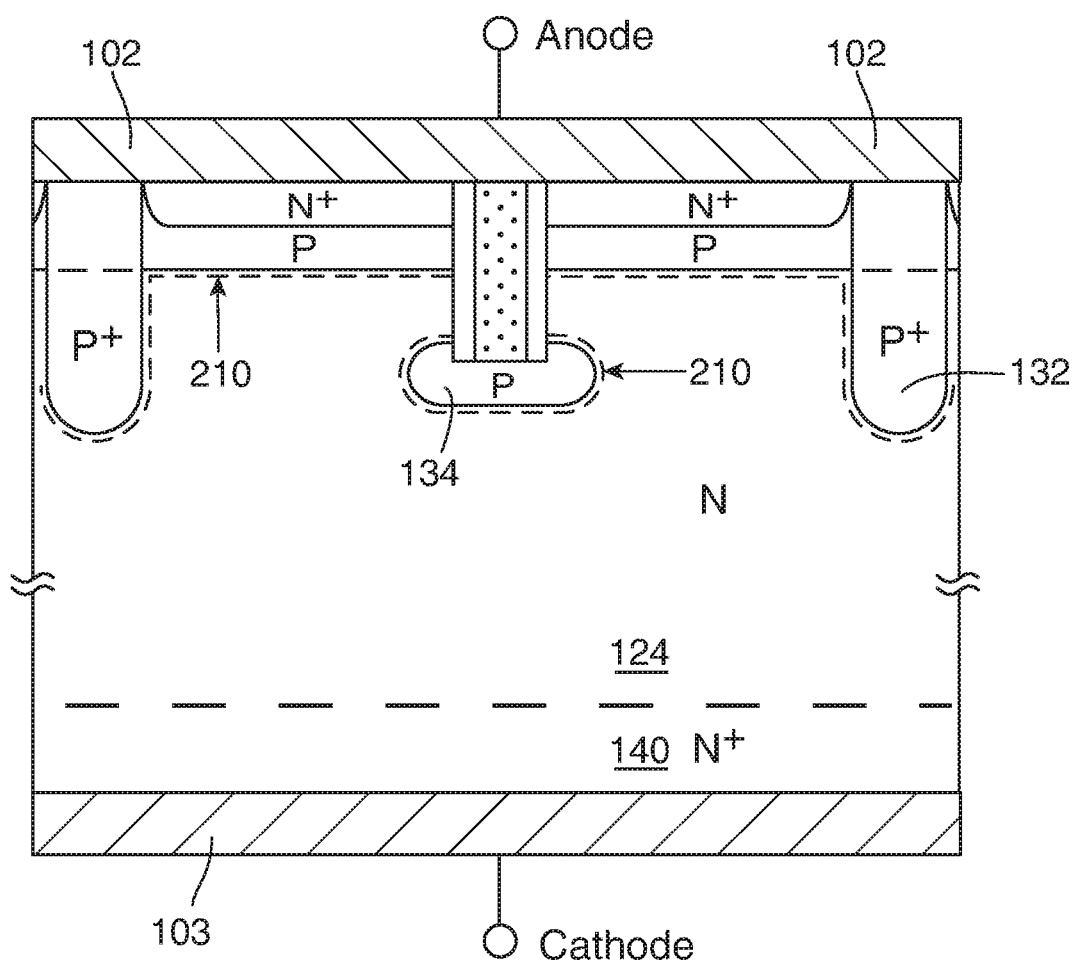
FIGS. 2A-2D show estimated depletion contours under different reverse bias values, for one sample implementation of the rectifier of FIG. 1A.

FIGS. 2A-2D show estimated depletion contours under different reverse bias values, for one sample implementation of the rectifier of FIG. 1A. FIG. 2A shows how, under zero bias, the depleted region 210 has only a small thickness below the body junction and around the p-type intermediate region. This drawing shows the depleted region 210 as an overlay on the drawing of FIG. 1A, to help show how the depleted region responds to different reverse bias conditions.

Figure 2B:
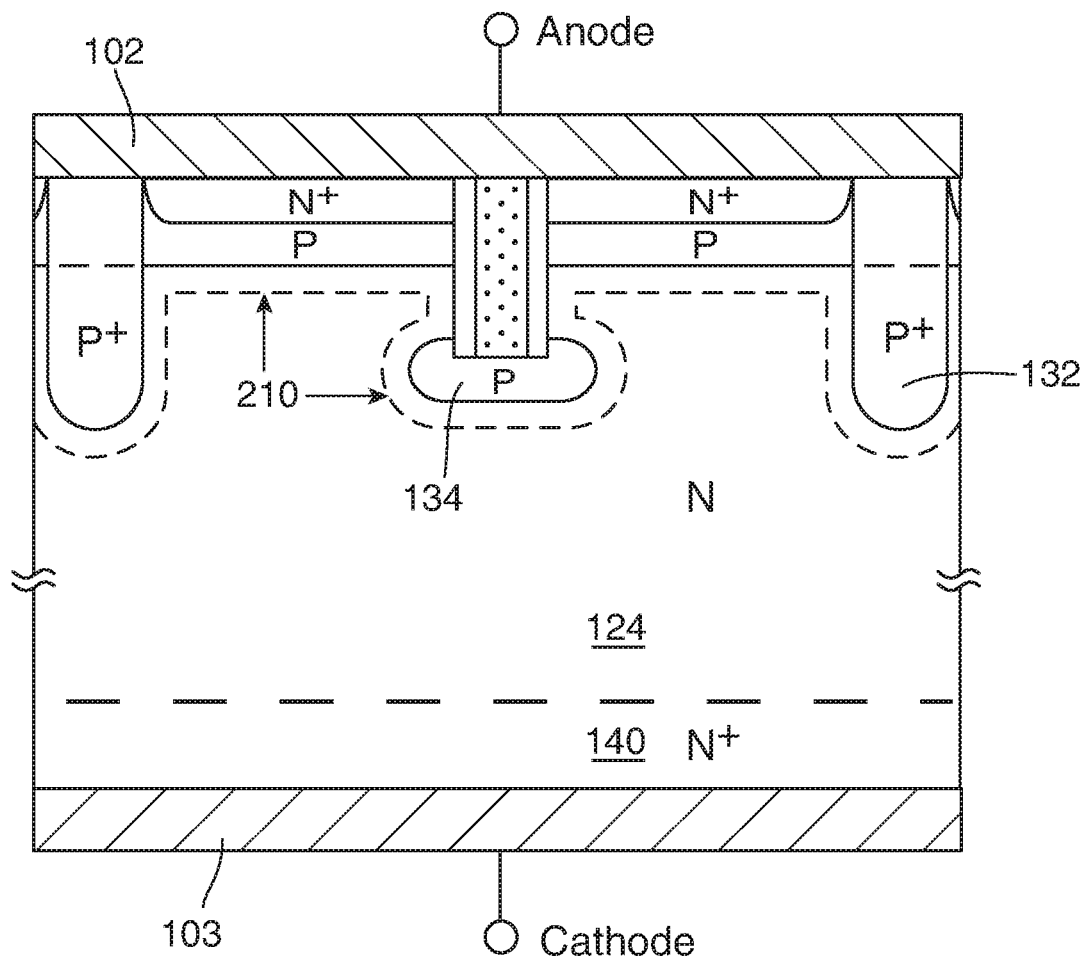

FIG. 2B shows how the shape of the depleted region 210 changes when some additional reverse bias is added onto the structure of FIG. 1A. Note that the thickness of the depleted region 210 is greater, below the body junction and around the p-type intermediate region, than in FIG. 2A. Note also that the depleted region 210 extends laterally, from the intermediate region, to show the potential for pinch-off.

Figure 2C:
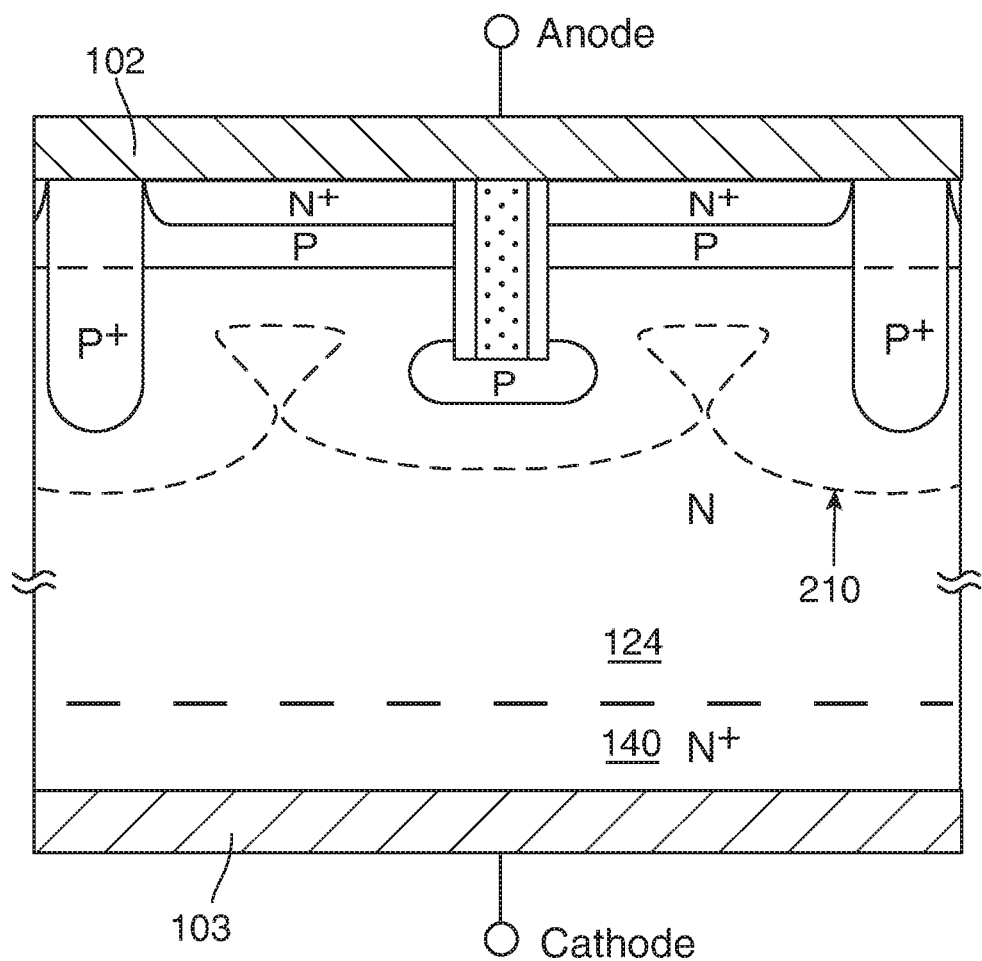

FIG. 2C shows how the shape of the depleted region 210 changes when further additional reverse bias is added onto the structure of FIG. 1A. This shows the shape of the depleted region 210 at pinchoff.

Figure 2D:
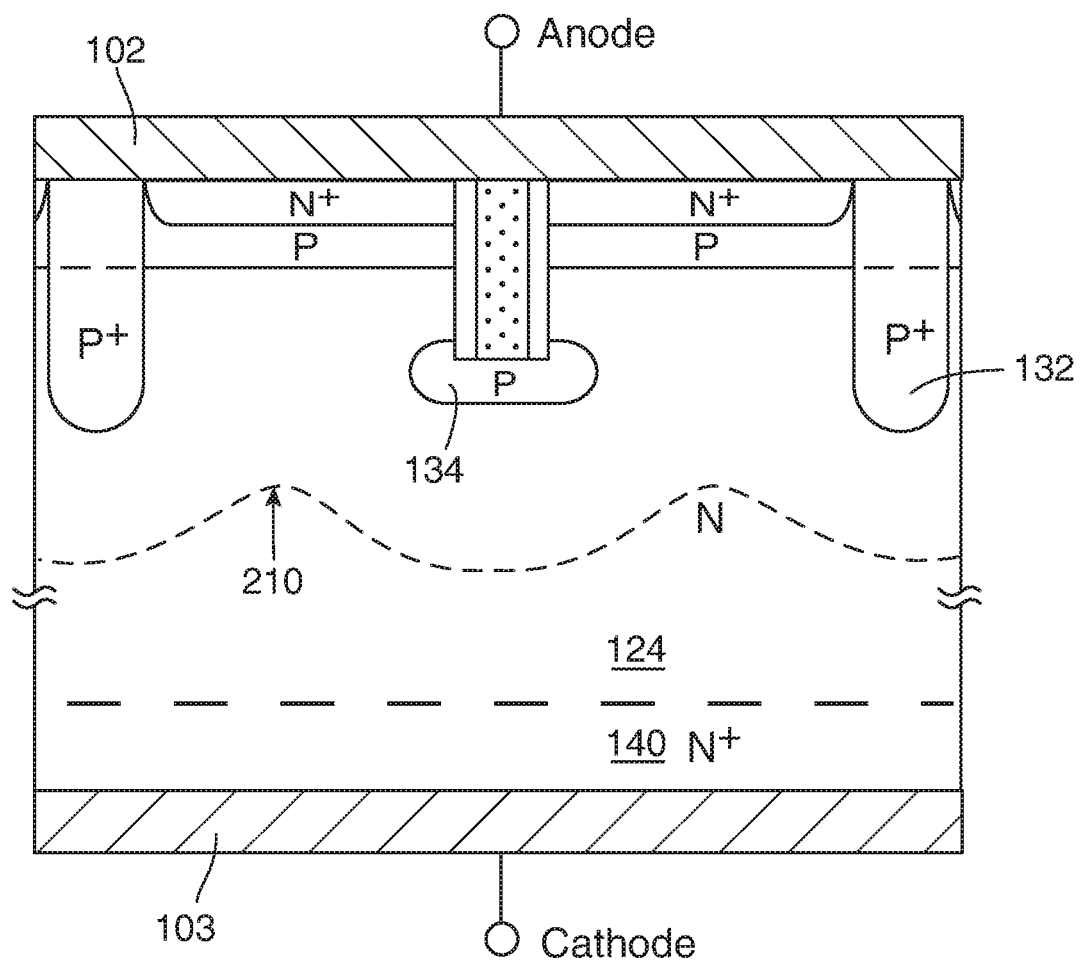

FIG. 2D shows how the shape of the depleted region 210 changes when still more reverse bias is added onto the structure of FIG. 1A. Note that the depletion boundary is now far removed from the body junction.

The threshold voltage $V_T$ of the trench MOS determines the minimum forward voltage. Under nonzero current, $V_F = V_T + V_{R1} + V_{R2}$, where $V_{R1}$ is the ohmic drop above the intermediate implant and $V_{R2}$ is the ohmic drop at and below the level of the intermediate implant. In this equation, the disclosed structure provides $V_{R1} \ll V_{R2}$, since most of the breakdown voltage will be sustained by the depleted volume of the drift layer 124 at and below the depth of the intermediate region 134.

Under larger forward bias the body diode will provide an additional current component, which may be large; this helps to limit forward voltage drop due to channel resistance in the MOS channel The current density can be treated similarly. Under forward bias, the current flowing through one unit cell will be approximately equal to the current of the MOS channel 112, plus diode current from the pn junction, plus leakage current. Under forward bias, the leakage current components are actually favorable, since they will add to total cell current. Under reverse bias, with the disclosed device structure, the leakage currents as well as the channel current will all be interrupted by the pinch-off of the drift region (i.e. by the operation of the deep JFET-like depletion transistor). Thus the structures of FIGS. 4A and 4B provide an increase in current density, without any substantial degradation of reverse leakage or breakdown.

Figure 4A:
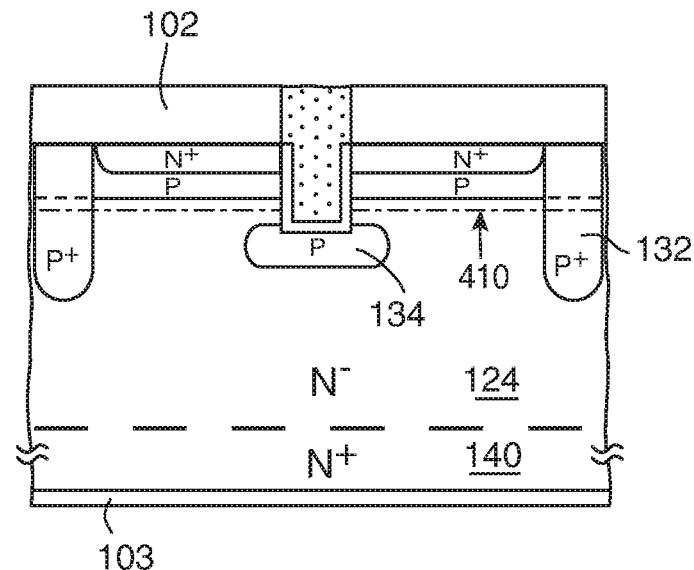
FIG. 4A, FIG. 4B, FIG. 5A, and FIG. 5B each show modifications of the device of FIG. 1A, in which additional doping is used to increase conduction through the MOS portion of the rectifier, above the locations where pinch-off occurs.

FIG. 4A shows a modification of the devices of FIG. 1A and 1B. Here an additional concentration 410 of donor species is added below the body junction. This increases conduction through the MOS portion of the rectifier, above the locations where pinch-off occurs.

Figure 4B:
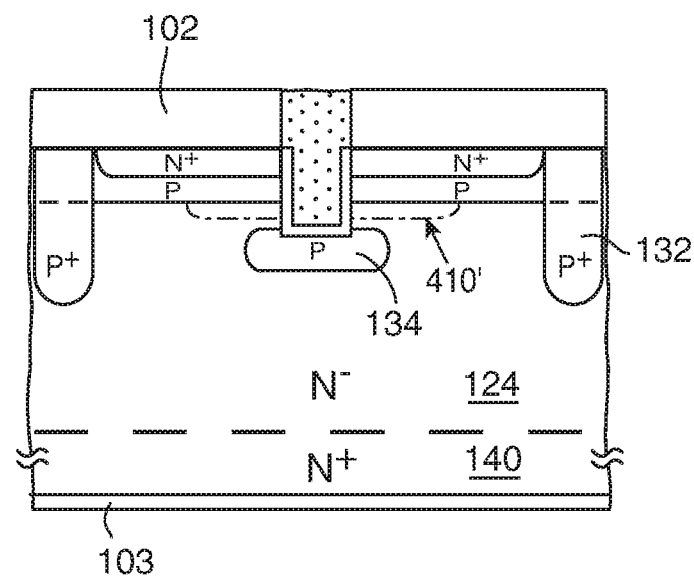

FIG. 4B shows another modification of the foregoing devices. In this example, the additional concentration 410' of donor species is added below the body junction in some areas, but not adjacent to the p+ body contact regions.

Figure 5A:
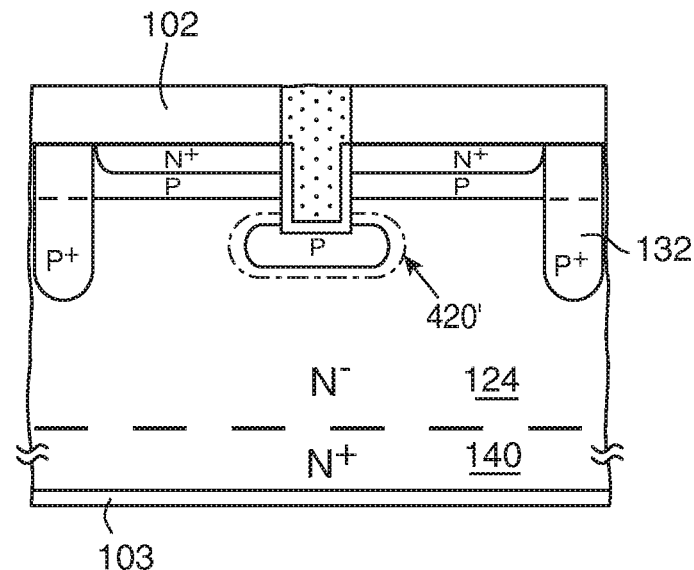
Figure 5B:
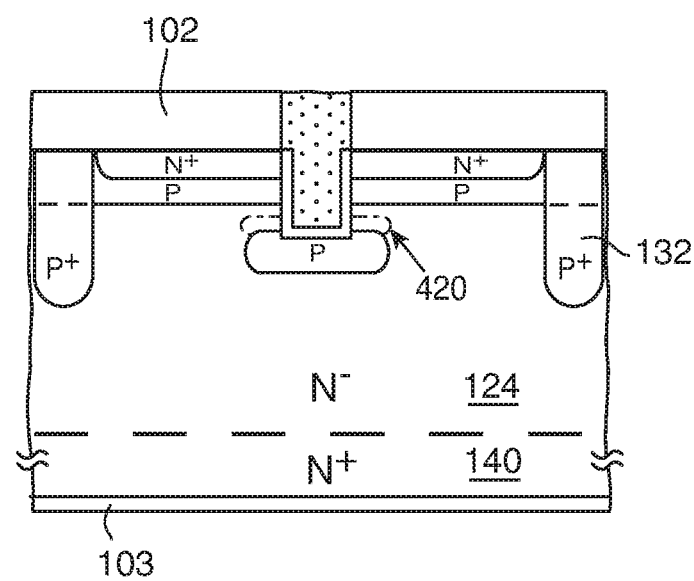

FIG. 5B shows another modification of the foregoing devices. In this example, an additional concentration 420 of donor species is added above the intermediate region. This increases conduction through the MOS portion of the rectifier, above the locations where pinch-off occurs. Here too, note that the voltage withstand capability of the device will not be degraded much, since at full reverse voltage most of the voltage drop will fall across the depleted volume of the drift region at depths lower than that of the intermediate region.

FIG. 5A shows another modification of the foregoing devices. In this example, an additional concentration 420' of donor species is self-aligned to surround the intermediate region. This increases conduction through the MOS portion of the rectifier, above the locations where pinch-off occurs. Here some fraction of the dopant 420' will be lower than the intermediate region.

The disclosed inventions variously result in a number of improvements in device characteristics, including e.g. the following:

1. High cell density: The higher cell density is in part the result of the vertical channel that is formed along the trench sidewall in the trench rectifier structure. Higher cell density results in greater current for the same amount of surface area, which increases overall device efficiency. Additionally, the presence of a single electrode on the top surface eliminates spacing requirements.

2. The resistance of the silicon between the point at which carriers emerge from the channel and the underlying n+ substrate is advantageously reduced, since the end of the channel is closer to the n+ substrate for the trench rectifier structure.

The structure of the trench rectifier is similar in some ways to that of a trench MOSFET, so many of the processing steps that are used in a conventional trench fabrication process flow may be used to fabricate a trench rectifier. However, there are several key differences. These differences and the processing step required for their fabrication are discussed below.

There is preferably a small but repeatable distance between the bottom of the p-type body region and the top of the p-type "p-intermediate" region along the trench sidewall. (The distance between the depletion regions of these two p-type diffusions significantly affects the characteristics of the trench rectifier.) This precise distance is obtained by implanting both the p-type body region and the p-type buried region using the same surface (i.e. the top surface of the wafer) as the reference for both these implantation steps. This self-aligned vertical distance is obtained by implanting the buried p-type region before the trench is etched. The process flow is different from the sequence used to fabricate other devices that have additional dopant present at the trench bottom. These other devices use dopant that is introduced after the trench is etched, not before, as in the fabrication sequence for the trench rectifier.

Optionally the process parameters can be tweaked so that the body-contact and p-type intermediate regions will have seen the same thermal history. This is not necessary, but can slightly help consistency.

Electrical contact to the p-type region that is located at the bottom of the trench can be made by one of the following two techniques:

Removing the oxide at the bottom of the trench and directly contacting the p-type intermediate region at the trench bottom; or Implanting stripes 132' of the p-type intermediate region into areas where the trench will not be formed, providing a buried lateral connection between the p-type intermediate region and the deep P+ region, which is in turn contacted at the wafer surface.

Since (in this implementation) all of the regions on the top surface are electrically connected to the same terminal, there is no requirement to space metal regions a specific distance apart. With no metal-to-metal spacing requirements, smaller dimensions may be used for the layout.

Similarly, since all of the regions on the top surface are electrically connected to the same terminal, there is no requirement for a separate contact opening for each region. With no contact-to-contact spacing requirement, smaller dimensions can be used for the layout.

The trench rectifier can operate across a voltage range of approximately 10V-1000V. This value is set by the thickness and the resistivity of the epitaxial layer used in its fabrication, or by the thickness and resistivity of the starting wafer.

The trench rectifier can use the same edge termination structure as a conventional trench MOSFET for the same breakdown voltage. Typical edge termination structures include a deep diffused region at the perimeter of the active area, a field plate, field limiting rings, etched structures, resistive field plates contacted at both edges, and a combination of these structures.

Figure 3A:
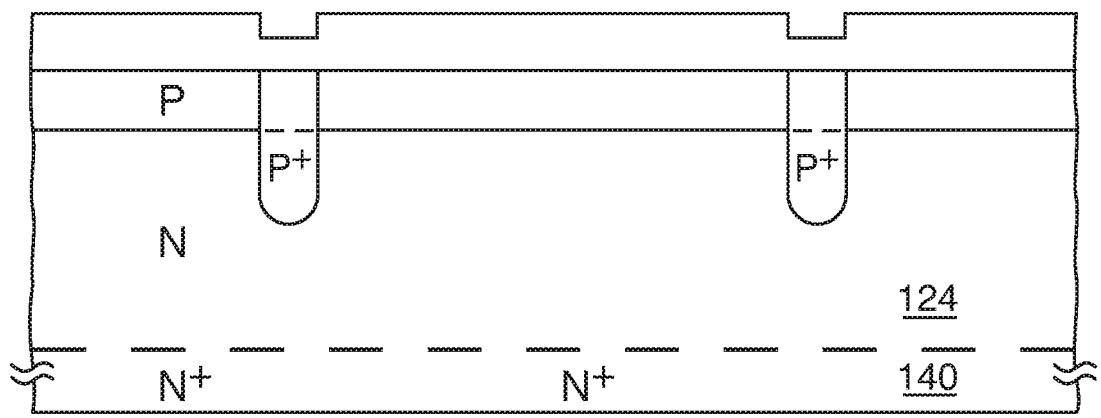
FIGS. 3A-3F show successive steps in fabrication of a device like that of FIG. 1A.

FIGS. 3A-3F show successive steps in one example of fabrication of a device like that of FIG. 1A. FIG. 3A shows an n on n+ starting structure, e.g. of silicon. Acceptor dopants have been introduced, without any patterning in the area shown, to define the body region. A thick oxide layer has been patterned to define locations of the deep p+ body contact region.

Figure 3B:
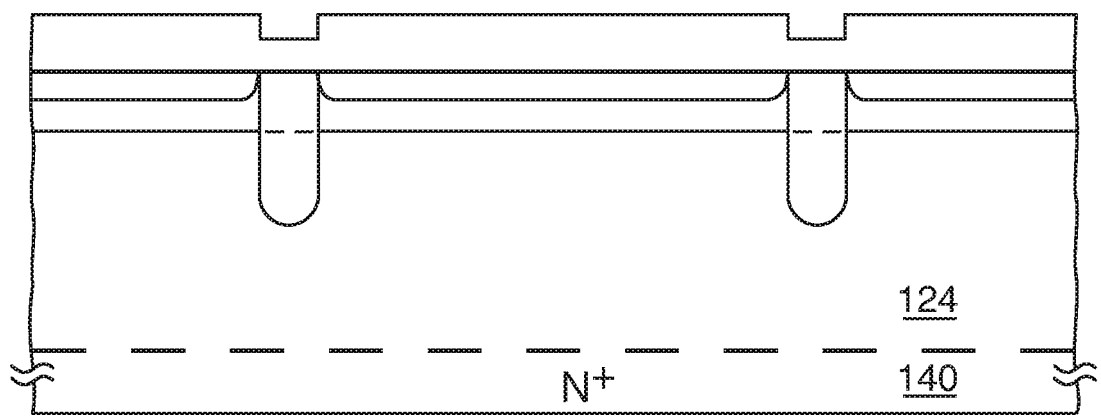

FIG. 3B shows a further stage, after the source region has been formed (e.g. by implantation).

Figure 3C:
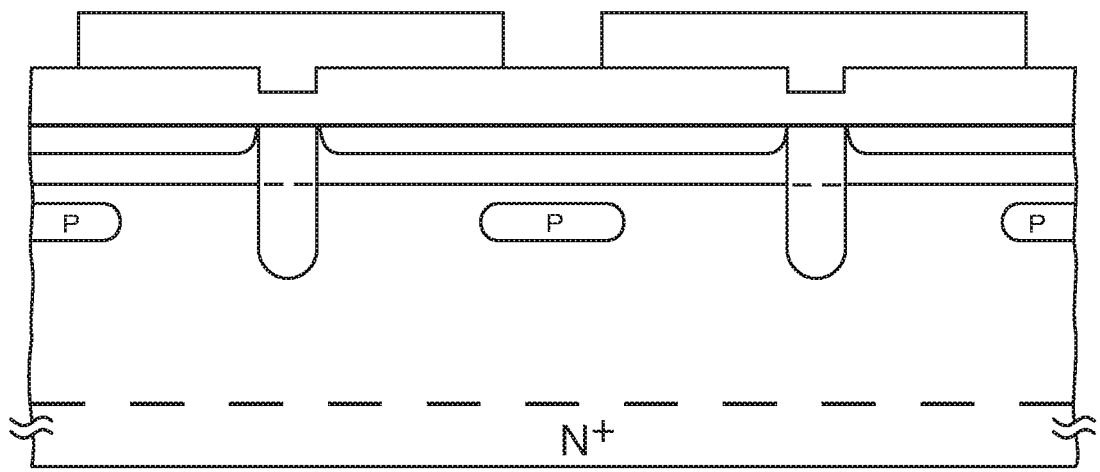

FIG. 3C shows a further stage, after the intermediate region has been formed (e.g. by implantation). Note that the gate trench is not yet present.

Figure 3D:
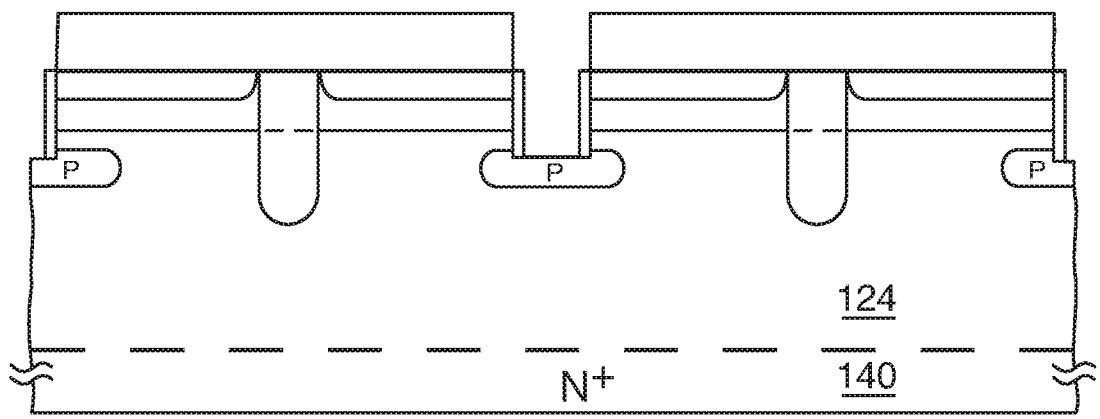

FIG. 3D shows a further stage, after the gate trench has been oxidized and etched. Note that the sequence of FIGS. 3C and 3D is not what would normally be expected.

Figure 3E:
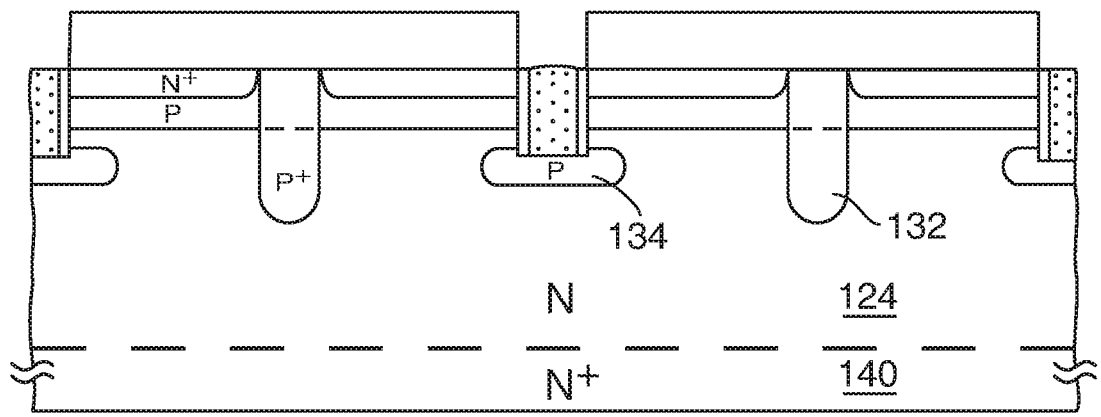
Figure 3F:
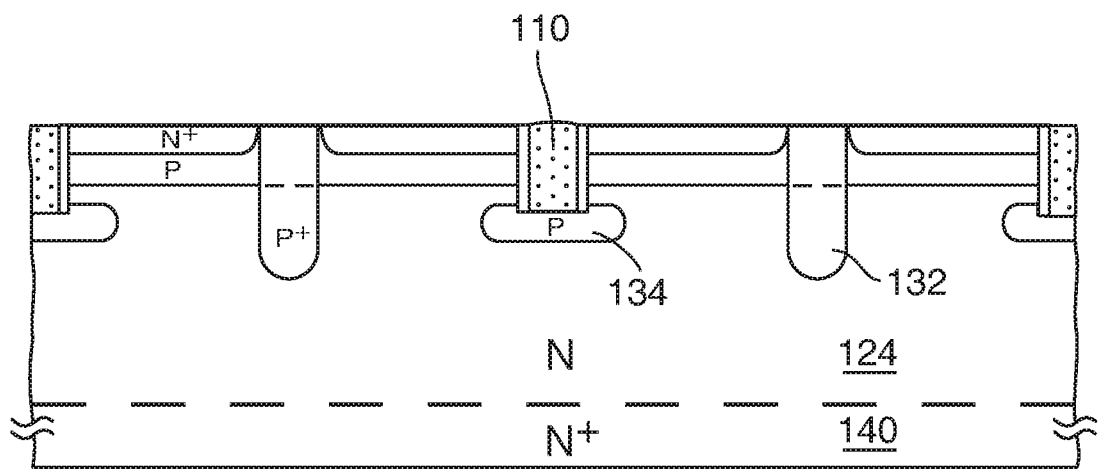

FIG. 3E shows a further stage, after the gate electrode has been formed in the trench. has been oxidized and etched. Note t FIG. 3F shows a further stage, after removal of the overlying oxide, and planarization of the semiconductor surface of the die. After this the front and back metallizations can be formed as uniformed unpatterned layers.

A variety of surface geometries may be used, including (but not limited to) interdigitated, or cellular with a triangular, square, hexagonal, octagonal, circular or oblong cell structure, either with the trench region in the center of the cell, or with the trench at the cell perimeter. A square cell is believed to be particularly advantageous for maximizing current density.

The forward voltage drop of the trench rectifier can be further improved by introducing additional n-type dopant in the region generally between the buried p-type region and the nearby P+ region. Increasing the n-type dopant concentration decreases the local resistance. This reduction in forward voltage drop can be achieved by several techniques.

One way to improve current density is to introducing n-type dopant below all or part of the p-type body region. As shown in the alternative versions of FIG. 4A and FIG. 4B this n-type dopant can be introduced across the entire cell, or just relatively close to the trench.

Sufficient n-type dopant should be introduced into the region of the epitaxial layer below the p-type body region to decrease the forward voltage drop of the device, but not enough to decrease its breakdown voltage. This n-type dopant will typically be introduced at a process step close to the step at which the p-type body dopant is introduced.

Another way to improve current density is to introducing n-type dopant so the buried p-type region is partially or totally surrounded by a region of n-type semiconductor with an increased level of dopant concentration. This dopant level is greater than that of the originally deposited n-type epitaxial layer as shown in FIG. 5A and FIG. 5B. The introduction of this n-type dopant can be performed just before or just after the introduction of the dopant to form the buried p-type region or p-intermediate since the enhanced n-type region should be aligned to the buried p-intermediate region. This will slightly degrade the leakage of the body junction, but (with proper choice of doping profile) this is not a problem in the disclosed structure.

It is also possible to use a combination of the techniques described in (1) and (2) above.

Figure 6:
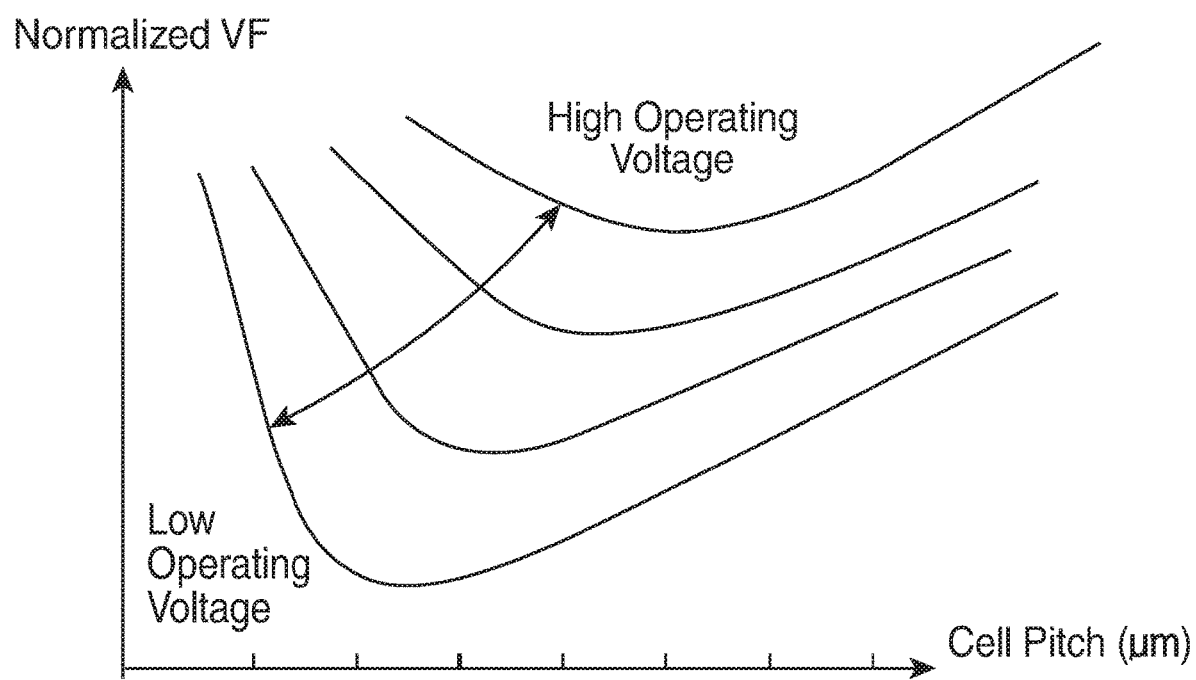
FIG. 6 shows a family of curves, illustrating how the forward voltage varies with cell pitch under different operating voltages.

The cell pitch may also be chosen to provide a relatively low normalized forward voltage drop for a given operating voltage as shown in FIG. 6. If the cell pitch is too small for a given operating voltage, the current flow path in the cell center is "pinched" by the deep P+ regions on either side, in combination with the p-intermediate region, increasing the forward voltage drop. In a related fashion, if the cell pitch is too large for a given operating voltage, the regions of the cell distant from the cell center do not conduct much current, so these areas of the cell are used inefficiently, thereby increasing the normalized forward voltage drop. In addition the depletion regions may not overlap to provide low leakage and a controlled pinch-off if too far apart.

1. The trench rectifier structure has a higher cell density than that of the field effect rectifier structure of the '748 patent. The higher cell density is a result of the vertical channel that is formed along the trench sidewall in the trench rectifier structure. The presence of the channel at the surface of the field effect rectifier structure of the '748 patent requires greater surface area. Higher cell density results in greater current for the same amount of surface area, which increases device efficiency.

It is believed that it is also possible to obtain rectification with this trench structure when the p-type region at the bottom of the trenches is left electrically floating. However, during switching, such a structure may not be as responsive as a trench rectifier with electrical contact to the p-type region at the trench bottom.

The trench rectifier device discussed so far does have a buried p-type region located along the trench sidewall and trench bottom. However, over a certain voltage range, it may be possible to completely eliminate this buried p-type region and still obtain the desired monotonic current versus voltage curve.

Figure 7A:
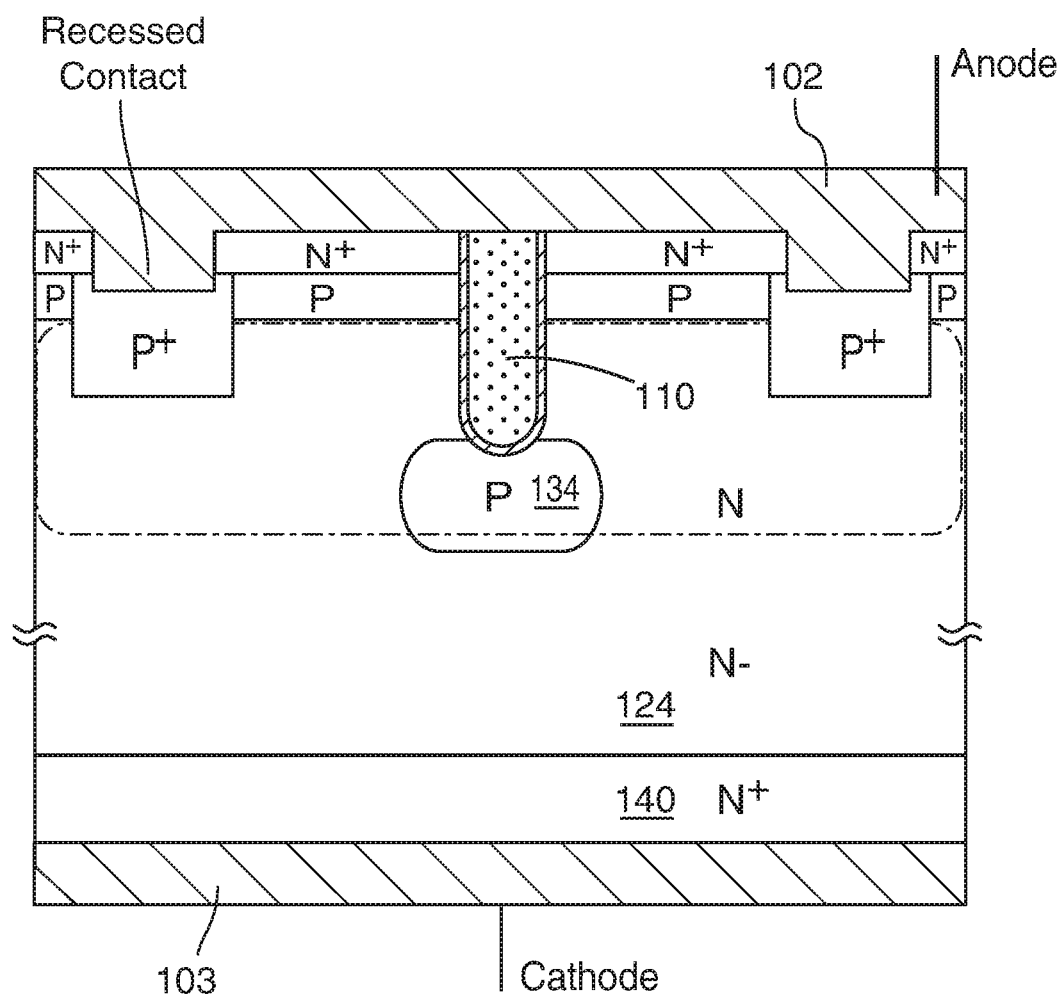
FIG. 7A shows another sample implementation of a rectifier in accordance with the instant inventions.
Figure 7B:
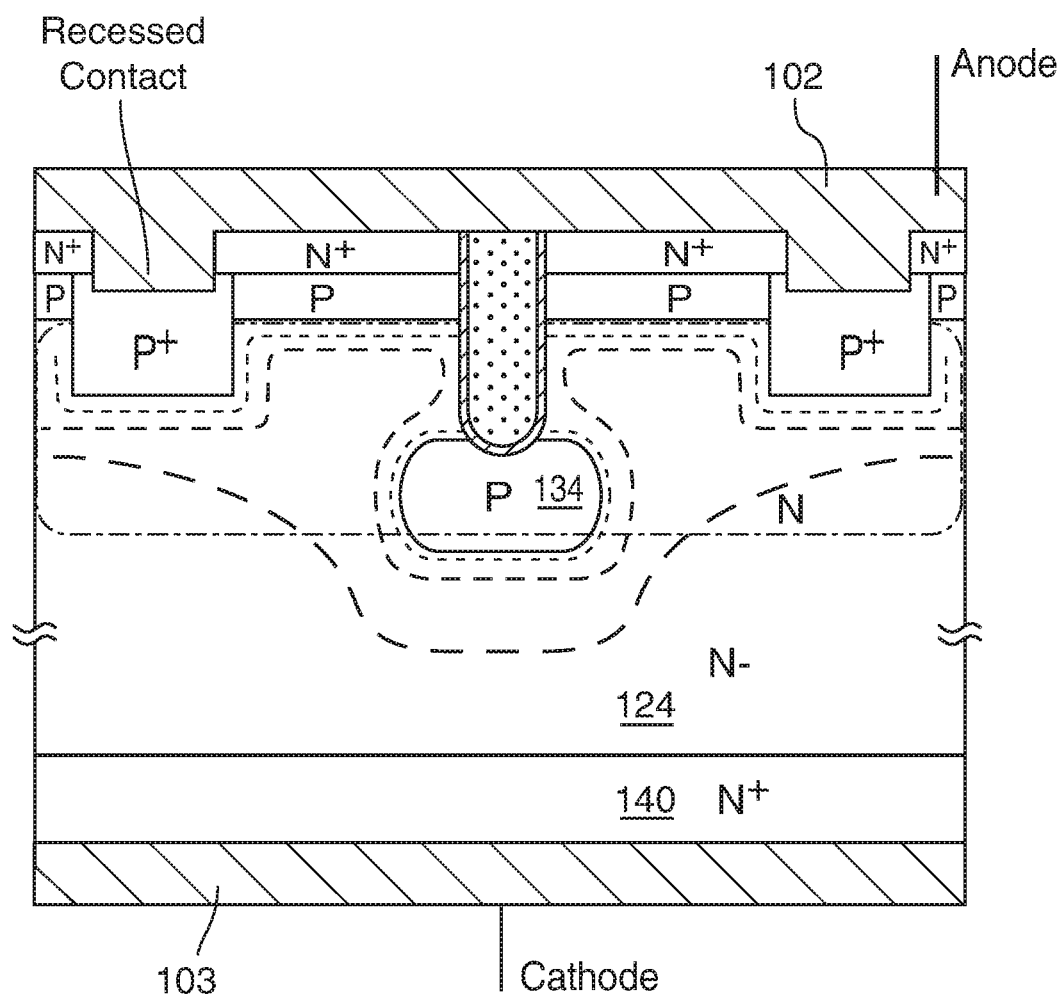
FIG. 7B shows three estimated depletion contours under different reverse bias values for one sample implementation of a device like that of FIG. 7A.

An alternative structure where the deep P+ region is replaced by a shallower P+ region using a recessed body contact is shown in FIG. 7A. This structure provides a high cell density. Estimated depletion boundaries, under various reverse bias conditions, are shown in FIG. 7B. In this alternative, the intermediate region below the gate trench still plays a beneficial role in moving the depletion boundary, and pinch-off still occurs (even though the converging depletion zones are not equal depths).

Advantages

The disclosed innovations, in various embodiments, provide one or more of at least the following advantages. However, not all of these advantages result from every one of the innovations disclosed, and this list of advantages does not limit the various claimed inventions.

Power semiconductor rectifiers with reduced heat dissipation;

Power semiconductor rectifiers with more ruggedness;

Power semiconductor rectifiers with higher breakdown voltage;

Power semiconductor rectifiers with lower on-resistance:

Power semiconductor rectifiers with lower cost;

Power converters with higher efficiency;

Motor driving circuits with improved efficiency; and

Improved efficiency in power conversion systems.

According to some but not necessarily all embodiments, there is advantageously provided: A semiconductor rectifier device, comprising, on a semiconductor die: a first-conductivity-type source region near a first surface of the die; a second-conductivity-type body region underlying the source region; a first-conductivity-type drift region underlying the body region; an insulated gate trench extending down through the body region into the drift region, containing a conductive gate electrode; a second-conductivity-type intermediate region under the gate trench; a second-conductivity-type body contact region, extending down through the body region into the drift region; a first metallization layer at the first surface, ohmically connected to the source region, the body contact region, and the gate electrode; a second metallization layer, at an opposite surface, which is ohmically connected to the drift region; wherein, under forward bias, majority carriers pass from the source region, through a portion of the body region which is inverted by capacitive coupling to the gate electrode, and therethrough into the drift region and to the second metallization; and wherein, under reverse bias, depletion regions extend laterally from the intermediate region and from the body contact region, within the drift region, to pinch off conduction between the body region and the second metallization.

According to some but not necessarily all embodiments, there is advantageously provided: a semiconductor rectifier device, comprising: a source region, near a first surface of a semiconductor material, having a first conductivity type; a body region having a second conductivity type, and underlying the source region; a drift region having a first conductivity type, and underlying the body region; an insulated gate trench extending down through the body region into the drift region; an intermediate region of the second conductivity type at the bottom of the gate trench within the drift region; a body contact region of the second conductivity type, extending down through the body region into the drift region; a first metallization layer at the first surface, connected to the source region, and body contact region, and the gate electrode; a second metallization layer, at a second surface which is opposite to the first surface, which is ohmically connected to the drift region; wherein, when the metallization layers are biased with a first polarity, majority carriers pass from the source region, through a portion of the body region which is inverted by capacitive coupling to the gate electrode, and therethrough into the drift region; and wherein, when the metallization layers are biased with an opposite polarity, depletion regions in the drift region spread from the intermediate diffusion and from the body contact regions to pinch off conduction between the body region and the second metallization.

According to some but not necessarily all embodiments, there is advantageously provided: a method of operating a semiconductor rectifier, comprising the actions of: when forward bias is applied between an anode terminal and a cathode terminal, allowing majority carriers to flow from a first-conductivity-type source region near a first surface of a semiconductor die, through a channel portion of a second-conductivity-type body region which underlies the source region, and thencethrough a first-conductivity-type drift region, which underlies the body region, to a drain region at a second surface of the dies; wherein the channel region is capacitively coupled to a gate electrode in an insulated trench; and wherein the source and body regions, and the gate electrode, are all connected to one of the anode and cathode terminals; and when reverse bias is applied between the anode and cathode terminals, allowing depletion regions to spread into the drift region from a second-conductivity-type body contact region which extends down through the body region and into the drift region, and also from a second-conductivity-type intermediate region which lies at least partly below the gate trench, to merge, at a reverse bias short of breakdown, to pinch off conduction below the depth of the channel region, and thereby substantially prevent leakage current from flowing between the anode and cathode terminals.

According to some but not necessarily all embodiments, there is advantageously provided: a method of making a semiconductor rectifier device, comprising the actions of, on a first-conductivity-type semiconductor die: a) performing on a first surface of the die, in any order, the steps of forming a first-conductivity-type source region, forming a second-conductivity-type body region underlying the source region, forming second-conductivity-type body contact regions which extend down through the body region into an underlying first-conductivity-type drift region of the die, and forming a second-conductivity-type intermediate region, at locations where a gate trench will be located, which is vertically separated from the body region by the drift region, wherein a top layer remains in place, on the first surface, while the body and intermediate regions are implanted; and b) after action a), performing, in any order, the steps of forming an insulated gate trench extending down through the body region and through the drift region into the intermediate region, forming a conductive gate electrode inside the insulated gate trench, and removing the top layer.

According to some but not necessarily all embodiments, there is advantageously provided: a new semiconductor rectifier structure. In general, a MOS-transistor-like structure is located above a JFET-like deeper structure. The present application teaches ways to combine and optimize these two structures in a merged device so that the resulting combined structure achieves both a low forward voltage and a high reverse breakdown voltage in a relatively small area. In one class of innovative implementations, an insulated (or partially insulated) trench is used to define a vertical channel in a body region along the sidewall of a trench, so that majority carriers from a "source" region (typically n+) can flow through the channel An added "pocket" diffusion, of the same conductivity type as the body region (p-type in this example), is provided around the bottom of the trench. This intermediate diffusion, and an additional deep region of the same conductivity type, define a deep JFET-like device which is in series with the MOS channel portion of the diode. This advantageously permits the MOS channel portion to be reasonably short, and to have a reasonably low threshold voltage, since the high-voltage withstand characteristics are defined by the deep JFET-like device.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

It is believed that it is also possible to obtain rectification with this trench structure when the p-type region at the bottom of the trenches left electrically floating. However, during switching, such a structure may not be as responsive as a trench rectifier with electrical contact to the p-type region at the trench bottom.

A layer of metal, doped poly, a metal silicide, or a combination of these layers can also be used to form the gate electrode.

The trench rectifier device discussed so far does have a buried p-type region located along the trench sidewall and trench bottom. However, over a certain voltage range, it may be possible to completely eliminate this buried p-type region and still obtain the desired monotonic current versus voltage curve.

Any of the trench rectifier structures described in the present application can be fabricated as a discrete device on a semiconductor substrate. However, it is also possible to include these structures in the same chip as one of a number of three terminal switching devices such as a DMOS FET, and IGBT, or a similar device. The vertical trench rectifier may also be included as a component in an integrated circuit.

The trench rectifier can be realized using silicon, silicon carbide or other semiconductor materials.

It is possible to use a process sequence that does self-align the P+ to the trench. However, with today's aligners, the misalignment is typically below 0.2 microns, so there is almost no penalty for using a non-self-aligned process. It should only decrease the pinch-off voltage slightly.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A semiconductor rectifier device, comprising, on a semiconductor die:
   a first-conductivity-type source region near a first surface of the die;
   a second-conductivity-type body region underlying the source region;
   a first-conductivity-type drift region underlying the body region;

an insulated gate trench extending down through the body region into the drift region, containing a conductive gate electrode;
a second-conductivity-type intermediate region under the gate trench;
a second-conductivity-type body contact region, extending down through the body region into the drift region;
a first metallization layer at the first surface, ohmically connected to the source region, the body contact region, and the gate electrode;
a second metallization layer, at an opposite surface, which is ohmically connected to the drift region;
wherein, under forward bias, majority carriers pass from the source region, through a portion of the body region which is inverted by capacitive coupling to the gate electrode, and therethrough into the drift region and to the second metallization;
wherein an additional first-conductivity-type doping is present near the bottom of the body region, to thereby increase conduction under forward bias;
and wherein, under reverse bias, depletion regions extend laterally from the intermediate region and from the body contact region, within the drift region, to pinch off conduction between the body region and the second metallization.

2. The semiconductor rectifier device of claim 1, wherein the gate trench extends down through the source region, as well as the body region, into the drift region.

3. The semiconductor rectifier device of claim 1, wherein the second metallization layer is ohmically connected to the drift region through a drain contact region which has the first conductivity type, and is more heavily doped than the drift region.

4. The semiconductor rectifier device of claim 1, wherein the die is silicon.

5. The semiconductor rectifier device of claim 1, wherein the die is monocrystalline.

6. The semiconductor rectifier device of claim 1, wherein the die includes an epitaxial layer on a substantially monocrystalline substrate.

7. The semiconductor rectifier device of claim 1, wherein the first conductivity type is n-type.

8. The semiconductor rectifier device of claim 1, wherein the first conductivity type is n-type, and the first metallization layer is connected to provide an anode terminal, and the second metallization layer is connected to provide a cathode terminal.

9. A semiconductor rectifier device, comprising:
a source region, near a first surface of a semiconductor material, having a first conductivity type;
a body region having a second conductivity type, and underlying the source region;
a drift region having a first conductivity type, and underlying the body region;
an insulated gate trench extending down through the body region into the drift region;
an intermediate region of the second conductivity type at the bottom of the gate trench within the drift region;
a body contact region of the second conductivity type, extending down through the body region into the drift region;
a first metallization layer at the first surface, connected to the source region, and body contact region, and the gate electrode;
a second metallization layer, at a second surface which is opposite to the first surface, which is ohmically connected to the drift region;
wherein, when the metallization layers are biased with a first polarity, majority carriers pass from the source region, through a portion of the body region which is inverted by capacitive coupling to the gate electrode, and therethrough into the drift region;
wherein an additional first-conductivity-type doping is present near the bottom of the body region, to thereby increase conduction under forward bias;
and wherein, when the metallization layers are biased with an opposite polarity, depletion regions in the drift region spread from the intermediate diffusion and from the body contact regions to pinch off conduction between the body region and the second metallization.

10. The semiconductor rectifier device of claim 9, wherein the gate trench extends down through the source region, as well as the body region, into the drift region.

11. The semiconductor rectifier device of claim 9, wherein the second metallization layer is ohmically connected to the drift region through a drain contact region which has the first conductivity type, and is more heavily doped than the drift region.

12. The semiconductor rectifier device of claim 9, wherein the semiconductor material is silicon.

13. The semiconductor rectifier device of claim 9, wherein the semiconductor material is a substantially monocrystalline die.

14. The semiconductor rectifier device of claim 9, wherein the semiconductor material includes an epitaxial layer on a substantially monocrystalline substrate.

15. The semiconductor rectifier device of claim 9, wherein the first conductivity type is n-type.

16. The semiconductor rectifier device of claim 9, wherein the first conductivity type is n-type, and the first metallization layer is connected to provide an anode terminal, and the second metallization layer is connected to provide a cathode terminal.

17. A method of operating a semiconductor rectifier, comprising the actions of:
when forward bias is applied between an anode terminal and a cathode terminal, allowing majority carriers to flow
from a first-conductivity-type source region near a first surface of a semiconductor die,
through a channel portion of a second-conductivity-type body region which underlies the source region, and thence
through a first-conductivity-type drift region, which underlies the body region, to a drain region at a second surface of the dies;
wherein the channel region is capacitively coupled to a gate electrode in an insulated trench;
and wherein the source and body regions, and the gate electrode, are all connected to one of the anode and cathode terminals;
and when reverse bias is applied between the anode and cathode terminals, allowing depletion regions to spread into the drift region
from a second-conductivity-type body contact region which extends down through the body region and into the drift region, and also
from a second-conductivity-type intermediate region which lies at least partly below the gate trench,
to merge, at a reverse bias short of breakdown, to pinch off conduction below the depth of the channel region, and thereby substantially prevent leakage current from flowing between the anode and cathode terminals;

wherein an additional first-conductivity-type doping is present near the bottom of the body region, to thereby increase conduction under forward bias.

\* \* \* \* \*